(12) United States Patent
Shmurun et al.

(10) Patent No.: US 6,495,233 B1
(45) Date of Patent: Dec. 17, 2002

(54) APPARATUS FOR DISTRIBUTING GASES IN A CHEMICAL VAPOR DEPOSITION SYSTEM

(75) Inventors: Inna Shmurun, Foster City, CA (US); Scott Hendrickson, Brentwood, CA (US); Gwendolyn Jones, Roseville, CA (US); Shankar Venkataraman, Santa Clara, CA (US); Son T. Nguyen, San Jose, CA (US); I-Chun Eugenia Liu, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 89 days.

(21) Appl. No.: 09/609,994

(22) Filed: Jul. 5, 2000

Related U.S. Application Data

(60) Provisional application No. 60/143,091, filed on Jul. 9, 1999.

(51) Int. Cl.[7] .............................. B32B 3/02; C23C 16/00
(52) U.S. Cl. .................... 428/64.1; 428/66.1; 428/66.6; 118/715; 118/718; 118/720; 118/713; 118/723 T; 118/723 IR; 118/723 E; 118/723 R; 118/723 ER; 118/724; 118/725

(58) Field of Search .................................. 118/715, 718, 118/723 T, 723 IR, 723 E, 723 R, 723 ER, 725, 724, 720, 713; 428/66.6, 64.1, 66.1

(56) References Cited

U.S. PATENT DOCUMENTS

| | | | |
|---|---|---|---|
| 5,725,675 A | 3/1998 | Fong et al. | 118/723 E |
| 6,110,556 A | * 8/2000 | Bang | 428/64.1 |

FOREIGN PATENT DOCUMENTS

| | | |
|---|---|---|
| TW | 327479 | 12/1997 |

* cited by examiner

*Primary Examiner*—Leszek Kiliman
(74) *Attorney, Agent, or Firm*—Moser, Patterson & Sheridan LLP

(57) ABSTRACT

A lid assembly for a semiconductor processing apparatus having at least two chambers comprises a lid plate having a first side and a second side and a plasma generation source mounted to the first side of the lid plate. Additionally, at least two gas boxes are coupled to the first side of the lid of the lid plate, and a divider is coupled between the plasma generation source and the at least two gas boxes.

24 Claims, 6 Drawing Sheets

APPARATUS FOR DISTRIBUTING GASES IN A CHEMICAL VAPOR DEPOSITION SYSTEM

CROSS REFERENCE

This application claims benefit of U.S. Provisional Application No. 60/143,091, filed Jul. 9, 1999, which is hereby incorporated by reference in its entirety. Additionally, this application is related to information disclosed in U.S. application Ser. No. 08/953,444, filed Oct. 17, 1997 now U.S. Pat. No. 6,110,556, and U.S. application Ser. No. 09/257,467, filed Feb. 24, 1999, now U.S. Pat. No. 6,300,255.

BACKGROUND OF THE DISCLOSURE

1. Field of the Invention

The invention relates to an apparatus for performing chemical vapor deposition. More particularly, the invention relates to a lid assembly for distributing gases within a chemical vapor deposition system having a plurality of chambers.

2. Description of the Background Art

Chemical vapor deposition, or CVD, is a well-known and practiced technique for the deposition of material on a substrate such as a semiconductor wafer. A CVD chamber is typically defined by electrically grounded walls and a lid. A pedestal for supporting a substrate is disposed within the chamber. A showerhead is disposed beneath the lid and above the pedestal. Coupled to the chamber is a gas panel and, for process conditions above atmospheric pressure (i.e., high-pressure systems), optionally a RF source. The gas panel is coupled to the showerhead and provides process and other gases to the chamber. The process gases and substrate are preheated to a temperature that facilitates thermal decomposition of the gases and substrate film formation. In high-pressure systems, the showerhead is coupled to the RF source. When used, the RF source drives the showerhead, igniting and sustaining a process gas plasma that enhances the deposition process for plasma-enhanced CVD (PECVD). Deposition occurs when the process gas or gases injected into the chamber react to form a layer of material upon the substrate. As the formed material is often additionally deposited on components within the CVD chamber other than the wafer, the gas panel typically also supplies a cleaning agent such as Fluorine to clean or "scrub" the chamber of unwanted deposition material remaining after wafer processing.

Although CVD remains a key process in the sequence of most integrated circuit manufacturing, pressure to create more robust, reliable, and cost effective processing equipment has increased with greater competition and pricing pressure within the integrated circuit manufacturing trade. One solution has been to use multi-chamber, or cluster tools. Although this solution increases system throughput, each chamber has a dedicated Fluorine source to facilitate cleaning processes. This redundancy of hardware among chambers increases system capital costs. Additionally, as more components comprise a system, the likelihood of service and downtime frequency increases as well. For example, systems that incorporate a dedicated plasma generation source can be particularly problematic as microwave magnetrons have a tendency to require service often.

Therefore, a need exists in the art for apparatus for CVD processing that provides increased reliability while reducing the overall system hardware costs.

SUMMARY OF THE INVENTION

The disadvantages of the prior art are overcome by the present invention of an apparatus for distributing gases in a chemical vapor deposition (CVD) system. In one aspect of the invention, a lid assembly for a semiconductor processing apparatus having at least two chambers comprises a lid plate having a first side and a second side and a plasma generation source mounted to the first side of the lid plate. Additionally, at least two gas boxes are coupled to the first side of the lid plate, and a divider is coupled between the plasma generation source and the at least two gas boxes.

In another aspect of the invention, a semiconductor processing apparatus comprises at least two chambers and a lid assembly disposed over the at least two chambers. The lid assembly comprises a lid plate having a first side and a second side, and a plasma generation source mounted to the first side of the lid plate. Additionally, at least two gas boxes are coupled to the first side of the lid plate, and a divider is coupled to the plasma generation source and the at least two gas boxes.

BRIEF DESCRIPTION OF THE DRAWINGS

The teachings of the present invention can be readily understood by considering the following detailed description in conjunction with the accompanying drawings, in which.

Figure 2:
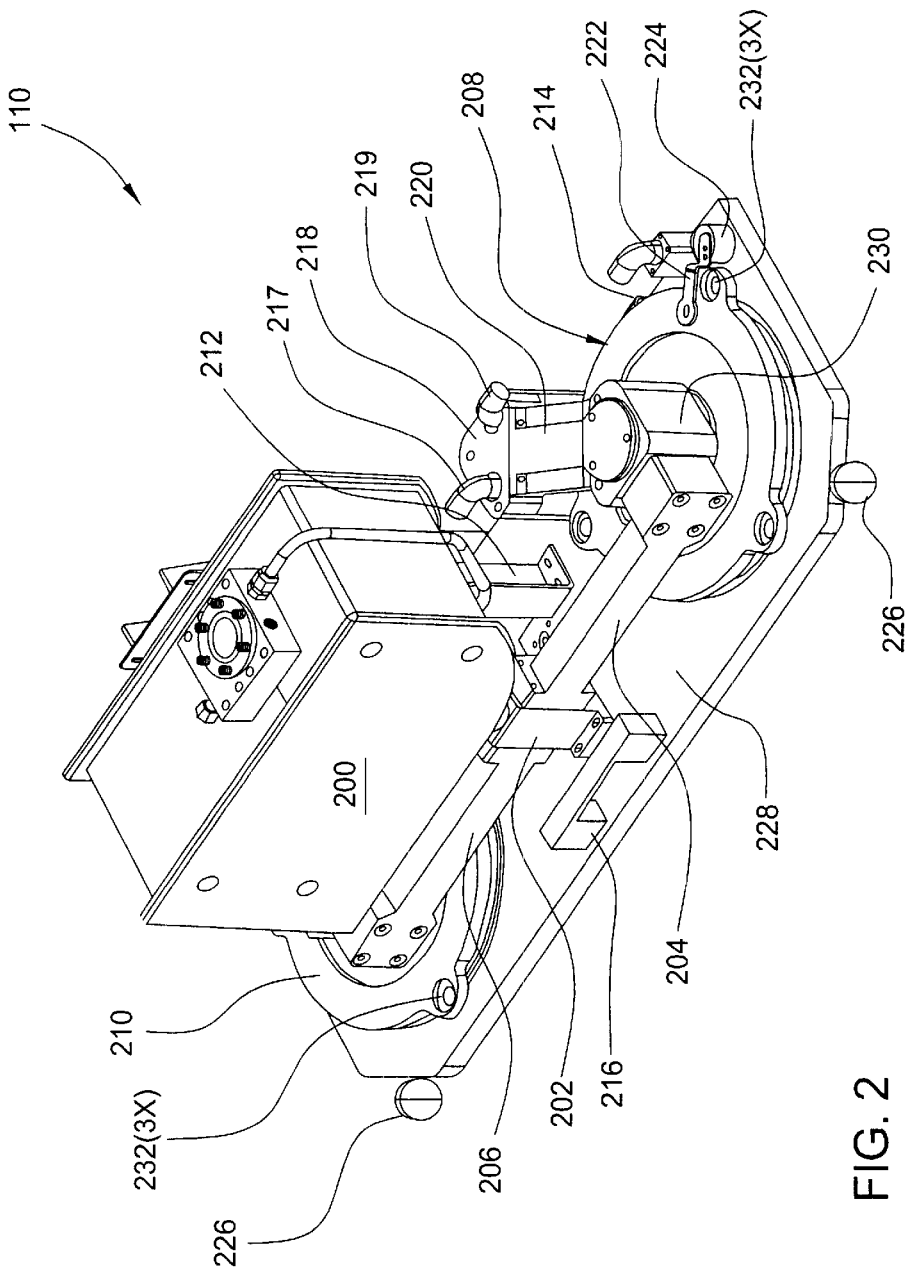
FIG. 2 depicts a perspective view of a lid assembly for the CVD system of FIG. 1.
Figure 3:
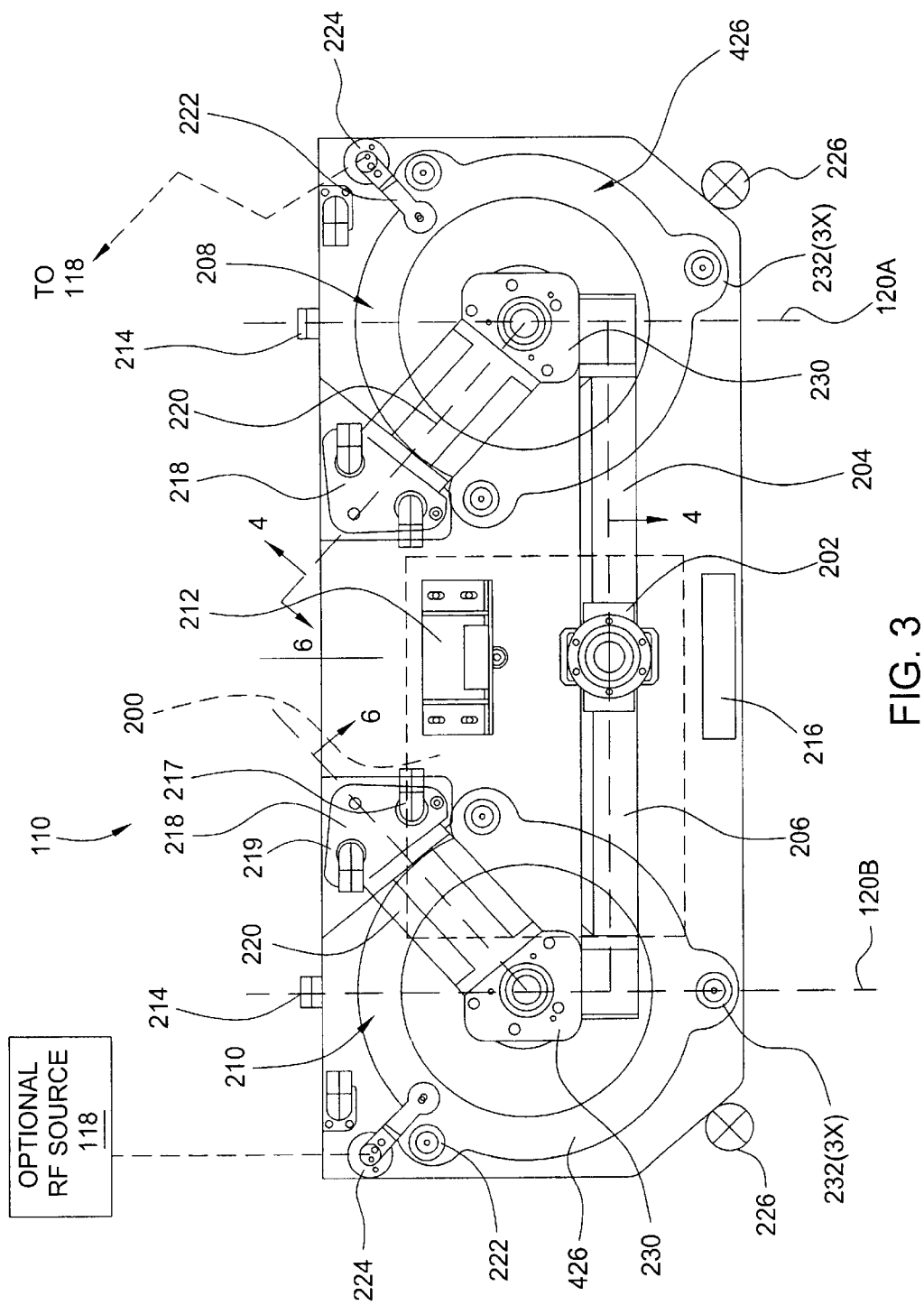
Figure 4:
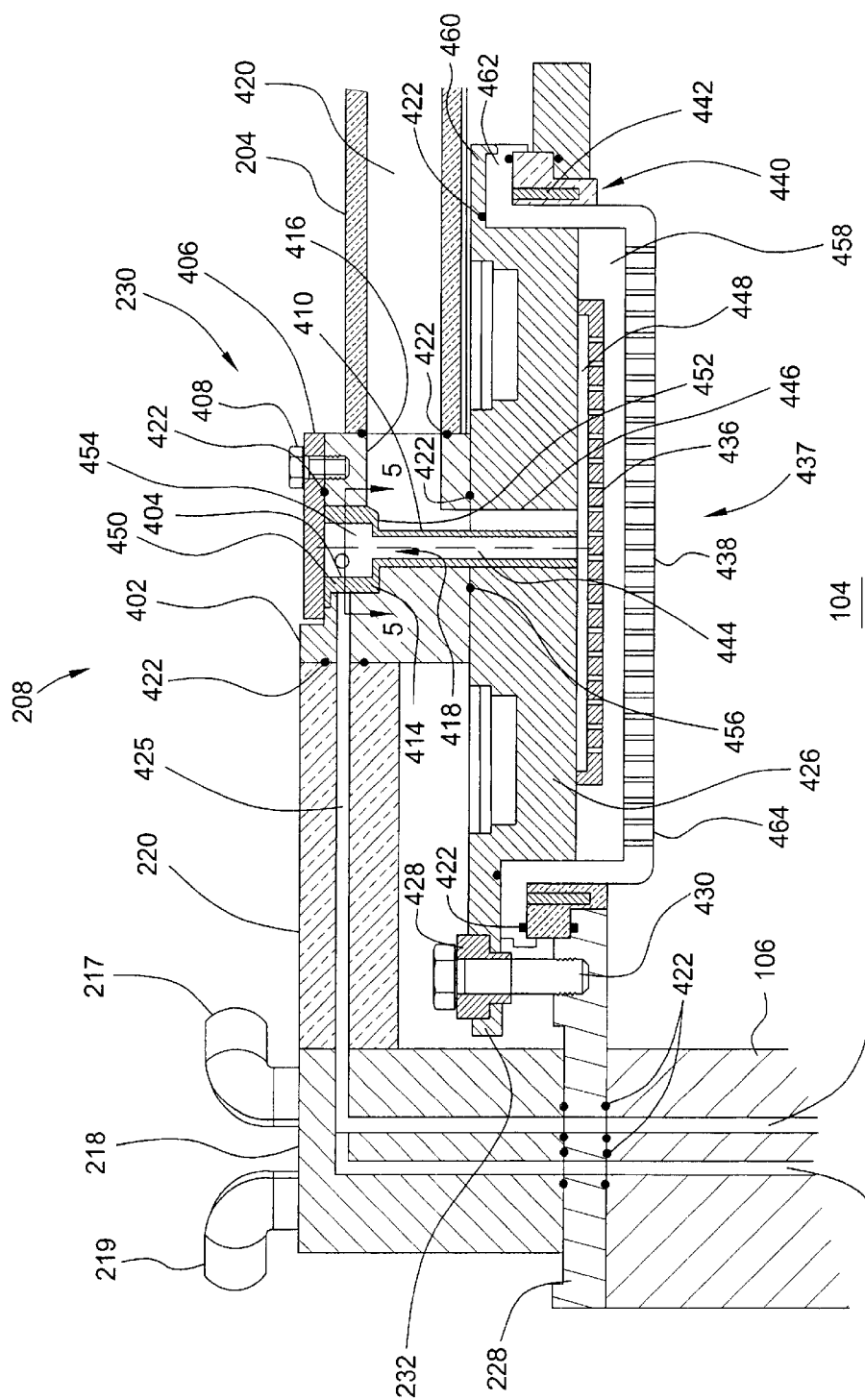
Figure 5:
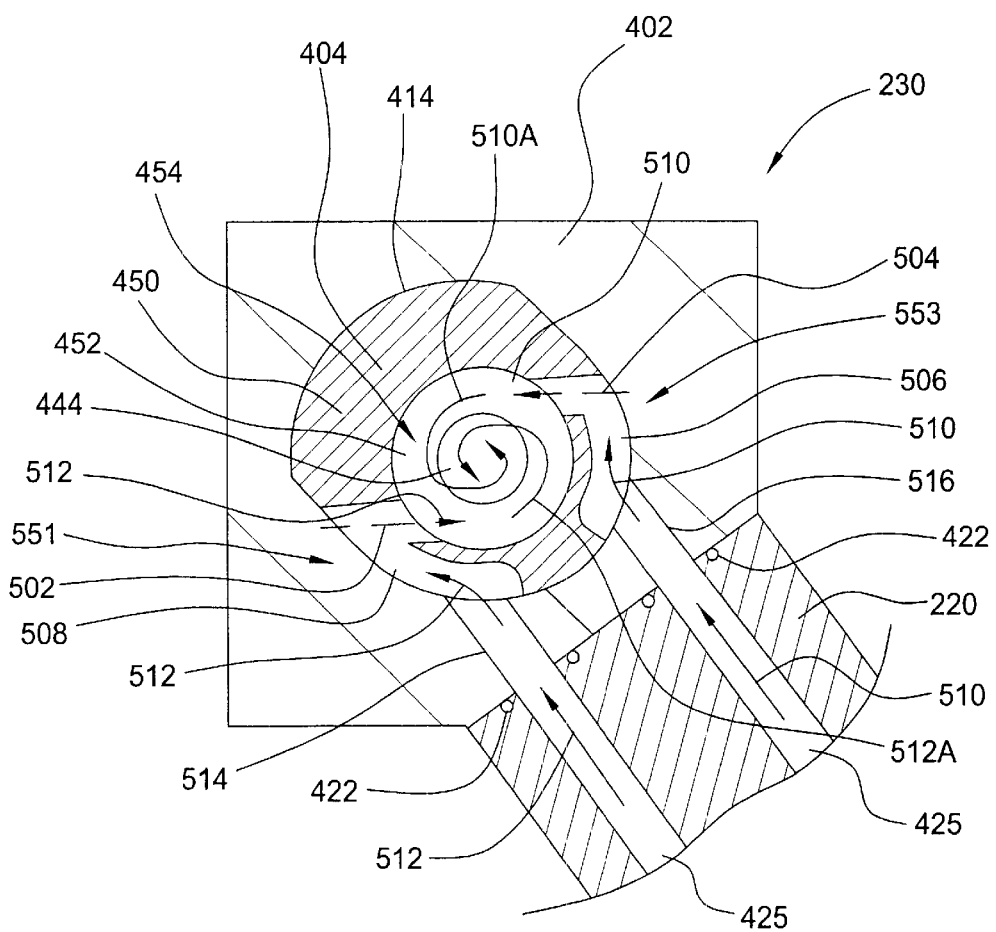
Figure 6:
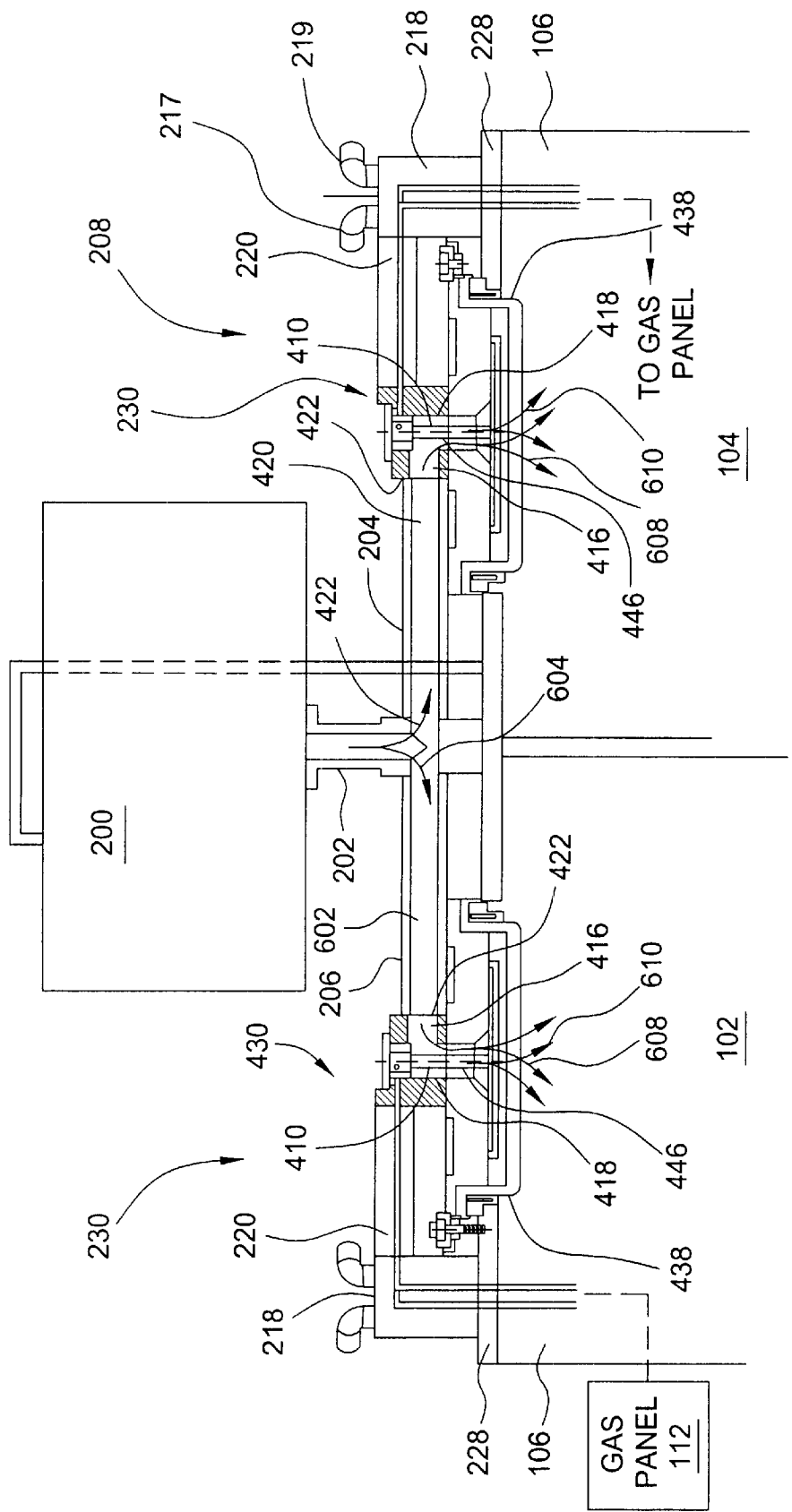

Fig; 3 depicts a top plan view of the lid assembly of FIG. 2;

FIG. 4 depicts a partial cross section of the lid assembly of FIG. 3 along section line 4—4;

FIG. 5 depicts a partial cross section of a mixing block taken along section line 5—5 of FIG. 4; and FIG. 6 depicts a partial cross section of the lid assembly taken along section line 6—6 of FIG. 3.

To facilitate understanding, identical reference numerals have been used, where possible, to designate identical elements that are common to the figures.

DETAILED DESCRIPTION

Figure 1:
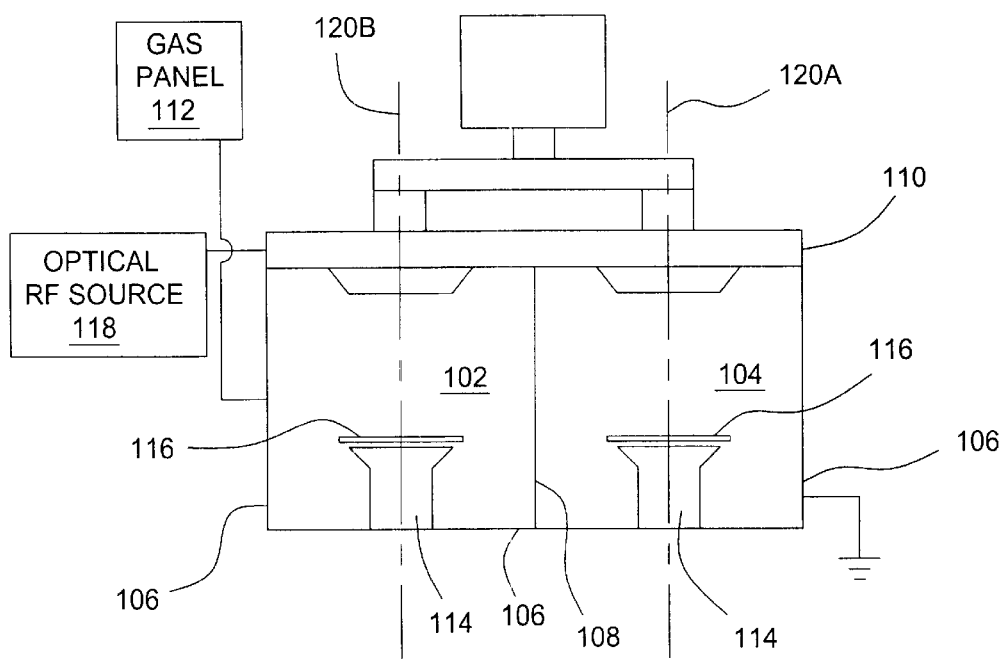
FIG. 1 depicts a schematic view of a CVD system in accordance with the subject invention.

A chemical vapor deposition apparatus 100 (CVD apparatus) of the present invention is depicted in FIG. 1. The CVD apparatus 100 has electrically grounded external walls 106, an internal wall 108, and a lid assembly 110, which concurrently define a first chamber 102 and a second chamber 104. The first and second chambers 102 and 104 are isolated from one another by the internal wall 108. A pedestal 114 is disposed within each of the chambers 102 and 104, respectively. Each pedestal 114 is substantially centered with respective chamber centerlines 120A and 120B. The pedestal 114 supports a substrate 116. The substrate 116 may rest, or alternately, be secured to the pedestal 114 through the use of electrostatic force, mechanical or vacuum clamping, gravitational force, and the like. A gas panel 112 is coupled to the CVD apparatus 100 and provides process and other gases as required for conventional CVD to occur within the first and second chambers 102 and 104. Examples of gases used during CVD are ozone, TEOS (tetraethylorthosilicate), NH3, SiH4 and the like. The CVD chamber 100 is optionally coupled to a RF source 118, and is discussed in greater detail below.

The lid assembly 110 is depicted in greater detail in FIG. 2 and FIG. 3. For the best understanding of the invention, the reader is encourage to view the perspective view of FIG. 2 simultaneously with the plan view of FIG. 3. One skilled in the art will readily recognize that the shape of the lid assembly 110, and the associated components described below are only limited as to the lid assembly's ability to distribute gases and seal the first and second chambers 102 and 104, respectively. Additionally one skilled in the art will readily recognize that although the CVD apparatus 100 is described as having only two chambers, this is for illustration only. The CVD apparatus 100 can readily accommodate a plurality of chambers and gas boxes, with a corresponding increase in the appropriate components as taught by the disclosure below.

The lid assembly 110 has a lid plate 228, plurality of gas boxes (i.e., a first gas box 208 and a second gas box 210) and a plasma generation source 200. The lid plate 228 is substantially rectangular in shape and is fabricated from a conductive material. The preferred material of construction for the lid plate 228 is aluminum. The lid plate 228 is affixed to one of the exterior chamber walls 106 by one or more hinges 214. To facilitate the opening of the lid plate 228, a handle 216 is provided. A fastening mechanism 226, i.e., a captive latch, secures the lid plate 228 to the chambers 102 and 104 when the lid assembly 110 in a closed position. The lid assembly 110 additionally comprises a pair of inlet manifolds 218 (one of which is partially obscured by the plasma generation source 200 in FIG. 2), and a pair of constant voltage gradient feed channels 220 (also, one of which is partially obscured by the plasma generation source 200 in FIG. 2). Each inlet manifold 218 is disposed upon the lid plate 228 adjacent to each gas box 208 and 210. The feed channel 220 is fabricated from a semi-conductive material (i.e., silicon carbide) having a passage 425 (see FIG. 4) that connects each inlet manifold 218 to the respective gas box. The feed channel 220 is fully described in the commonly assigned U.S. Pat. No. 5,725,675, and is hereby incorporated by reference. The feed channel 220 thus electrically isolates the inlet manifold 218 from the gas boxes 208 and 210. To control the temperature of the lid assembly 110, each inlet manifold 218 comprises an inlet heat exchange fitting and outlet heat exchange fitting 217 and 219 respectively, for circulating a cooling fluid, e.g., water. The cooling fluid circulates at a temperature range of 65° C. to 70° C. through channels (not shown) extending through each inlet manifold 218 and the lid assembly 110.

The plasma generation source 200 generates a cleaning agent for removing unwanted deposition material from the plurality of chambers (i.e., chambers 102 and 104). Cleaning agents for deposition material removal are well known in the art, however, atomic Fluorine is preferred. Such plasma generation sources are commercially available from Azte Corporation (ASTRON Model). The plasma generation source 200 is centrally supported above the lid plate 228 by a bracket 212. The bracket 212 is fastened to the lid plate 228 by conventional means such as welding, riveting, machine screws and the like.

The plasma generation source 200 supplies the cleaning agent to the chambers 102 and 104 via a divider 202, a first conduit 204, and a second conduit 206. The divider 202 is coupled to the plasma generation source 200. The divider 202 is additionally coupled to both the first conduit 204 and the second conduit 206, forming a "tee". The first conduit 204 couples the divider 202 to the first gas box 208 while the second conduit 206 couples the divider 202 to the second gas box 210. The first and second conduits 204 and 206 are fabricated from a dielectric material as to electrically isolate the gas boxes 208 and 210 from the plasma generation source 200. The cleaning agent thus enters the respective chamber by flowing out of the plasma generation source 200 into the divider 202, then through the respective conduit and gas box into the respective chamber. A description of the cleaning agent flow through the gas box is detailed below.

The first gas box 208 and second gas box 210 are best understood by simultaneously referring to FIG. 3 and FIG. 4. The first gas box 208 and second gas box 210 each comprise a mixing block 230, a mounting plate 426, an isolator 440, and a showerhead 437. The showerhead 437 comprises a blocker plate 436 and a faceplate 438. The first gas box 208 is centrally disposed in the lid plate 228 along the chamber centerline 120A. The second gas box 210 is centrally disposed in the lid plate 228 along the chamber centerline 120B. The first and second gas boxes 208 and 210 are generally circular in shape, and have three mounting holes 232 in each mounting plate 426. The mounting plate 426 is fabricated from a conductive material, preferably aluminum. A RF coupling tab 222 couples the mounting plate 426 of the first and second gas boxes 208 and 210 to an optional RF source 118. The RF power is coupled through the mounting plate 426 to the faceplate 438. An insulator 224 electrically isolates the RF coupling tab 222 from the lid plate 228.

One mixing block 230 is centrally disposed atop each of the gas boxes 208 and 210, respectively. The mixing block 230 is depicted in greater detail in FIG. 4 and FIG. 5. The reader is encouraged to simultaneously refer to FIG. 4 and FIG. 5 for the best understanding of the invention. The mixing block 230 comprises a housing 402, a vortex generator 404, a gas delivery tube 410 and a cap 406. The housing 402 is preferably fabricated from aluminum. The housing 402 has a slot 414 that communicates with a bore 418. The slot 414 additionally intersects a first gas inlet 514 and a second gas inlet 516. The slot 414 has a substantially elliptical shape, the purpose of which will become apparent below. A side port 416 passes into the mixing block 230 and intersects the slot 414 or bore 418, or both slot 414 and bore 418 as to allow fluid communication between the slot 414, bore 418, and side port 416.

"The vortex generator 404 is disposed within the slot 414. The vortex generator 404 is shaped to conform to (i.e., be placed within) the slot 414, and is preferably fabricated from aluminum. The conformal geometry between the slot 414 and the vortex generator 404 prevents rotation of the vortex generator 404 within the slot 414. As such, although the slot 414 is preferred as an ellipse, other geometry's can function equally as well. The vortex generator 404 has a wall 450 and a bottom 452 that define a substantially cylindrical interior volume 45. The bottom 452 has an exit aperture 456. A first cutout 508 extends into, but not through the cylindrical wall 450. In the embodiment of FIG. 4, the first cutout 508 circumscribes a first portion 551 of the cylindrical wall 450. A second cutout 510 also extends into, but not through the cylindrical wall 450. In the embodiment in FIG. 4, the second cutout 510 circumscribes a second portion 553 of the cylindrical wall 450. A first aperture 502 that intersect the first cutout 508 pierces the cylindrical wall 450. A second aperture 504 that intersects the second cutout 510 also pierces the cylindrical wall 450. The first and second apertures 502 and 504 are laterally offset about the center of the vortex generator 404 In the embodiment depicted in FIG. 4, the first and second apertures 502 and 504 are preferably 180 degrees apart. However, a person skilled in the art will recognize that the first and second apertures 502 and 504, as well as each of the respective cutouts 508 and 510, may be positioned less than 180 degrees apart. In either adaptation, a fluid, (i.e., process and other gases) entering the vortex generator 404 from the first and second apertures 502 and 504, create a cyclonic flow as depicted by the flow arrows 510A and 512A. That is, the fluid 510 and 512 flows through the passages 425 of tie feed channel 220, which communicates with the respective cutouts 508 and 510 of the vortex generator 404. The cyclonic flow thoroughly mixes the gases exiting the first and second apertures 502 and 504 in the interior volume 454 of the vortex generator 404. A person skilled in the art will recognize that the first and second cutouts 508 and 510 may be configured such that the first and second apertures 502 and 504 create either a counterclockwise cyclonic fluid flow (flow arrows 510A and 512A) or a clockwise cyclonic fluid flow (not shown). Furthermore, one skilled in the art will additionally recognize that the vortex generator 404 may be consolidated with the housing 402.

The gas delivery tube 410 having a center passage 444 is affixed to the bottom 452 of the vortex generator 404 and passes through the mounting plate 426. The center passage 444 is aligned with the exit aperture 456 so that process and other gases passing through the vortex generator 404 flow through the exit aperture 456 and center passage 444 and into the respective chamber as further detailed below.

The vortex generator 404 is disposed within the slot 414. The conformal geometry of the vortex generator 404 and the slot 414 is such that the first and second cutouts 508 and 510 automatically align with the first and second gas inlets 514 and 516 respectively. The cap 406 retains the vortex generator 404 in the housing 402. The cap 406 is fastened to the housing 402 by a plurality of fasteners 408 (i.e., machine screws). Between the cap 406 and the housing 402 is an o-ring 422. The o-ring 422 is of a material compatible with the process and other gases used in the CVD apparatus 100. Such materials are readily known in the art, for example CHEMREZ™. The o-ring 422 prevents the process and other gases from escaping the housing. Please note that all other o-rings heretofore referred to will be assigned the same reference numeral 422 of simplicity sake. All o-rings 422 are intended to be of the same material. Of course, the size of a given o-ring will vary.

Referring back to FIG. 3 and FIG. 4, the mixing block 230 is disposed upon the mounting plate 426. The o-ring 422 resides between the mixing block 230 and mounting plate 426 as to prevent the escape of process and other gases (including cleaning agents). The mounting plate 426 is fabricated from a material, preferably aluminum. The mounting plate 426 has a flange 460 and is coupled to the RF coupling tab 222. The mounting plate 426 has a center hole 446 to allow passage of the gas delivery tube 410 and the cleaning agent. Disposed below the mounting plate 426 is the blocker plate 436 of the showerhead 437. The blocker plate 436 is perforated to allow gas passage. The blocker plate 436 and the mounting plate 426 form a gap 448 that causes the various gases exiting the mixing block 230 to diffuse radially outward.

The faceplate 438 of the showerhead 437 is dish shaped with a rim 462 and a perforated bottom 464. The faceplate 438 is fabricated from a conductive material, preferably aluminum. The rim 462 of the faceplate 438 abuts against the flange 460. The rim 462 additionally abuts against the isolator 440. The isolator 440 electrically insulates the respective gas box from the lid plate 228. The isolator 440 is fabricated from an insulative dielectric material such as fluoropolymers and ceramics. Isolators 440 comprised of fluoropolymers (i.e., TEFLON™) and other softer dielectrics should have a stiffening ring 442 (i.e., an aluminum ring). The stiffening ring 442 must be configured as not to defeat the insulative function of the isolator 440. The three mounting holes 232 pass through the mounting plate 426. The mounting hole 232 accepts a fastening screw 428 that secures the mounting plate 426 to the lid plate 228. A dielectric bushing 428 insulates the fastening screw 430, and consequently the lid plate 228, from the mounting plate 426.

Defined between the blocker plate 436 and the faceplate 438 is a plenum 458. The various gases passing through the blocker plate 436 enter the plenum 458 and are subjected to a slight flow restriction caused by the perforated bottom 464 of the faceplate 438. This causes the various gases to further diffuse radially across the faceplate 438, causing a uniformly distributed flow of gas passing through the perforated bottom 464 and into the respective chamber.

A series of o-rings 422 are disposed between the isolator 440 and lid plate 228, the isolator 440 and faceplate 438, and the faceplate 438 and feed channel 436 to ensure gas delivery into the respective chamber.

The delivery of the process and other gases from the gas panel 112 into the chambers 102 and 104 can be best understood by simultaneously referring to FIG. 4 and FIG. 6. The chamber 106 has internal gas passages 424 that are fluidly coupled to the gas panel 112. The lid plate 228, inlet manifold 218, and manifold conduit 220 also have internal gas passages 424. The gas passages 424 within the chamber wall 106, lid plate 228, inlet manifold 218 are aligned and sealed with o-rings 422 to allow the process and other gases to flow without leakage from the gas panel 112 to the mixing block 230 of each gas box 208 and 210. Of course, one skilled in the art will readily recognize that the gas panel 112 connected to the mixing block 230 in a number of alternate ways.

The interface between the mixing block 230 and the inlet manifold 218 is depicted in greater detail in FIG. 5. The internal gas passages 424 of the inlet manifold 218 are aligned respectively with the first gas inlet 514 and second gas inlet 516 and sealed with o-rings 422. Process and other gases flowing from the gas panel 112 enter the mixing block 230 as depicted by the flow arrows 510 and 512. The gas flow represented by flow arrow 512 enters the mixing block 230 through the first gas inlet 514, passes into the first cutout 508 of the vortex generator 404 through the first gas inlet 514, passes into the first cutout 508, and into the interior 454 via the first aperture 502. The gas flow represented by flow arrow 510, enters the mixing block 230 through the second gas inlet 516, passes into the second cutout 506 of the vortex generator 404 and subsequently into the interior 454 via the second aperture 504. The gas flows, represented by arrows 510 and 512, combine in the interior 454 of the vortex generator 404 in a cyclonic flow, depicted by flow arrows 510A and 512A, which thoroughly mixes the gases. Referring back to FIG. 6, the mixed gas exits the mixing block 230 via the gas delivery tube 410, entering the respective chambers through the faceplate 438 in the manner described above and represented by flow arrows 610. Although the disclosed embodiment depicts two internal gas passages 424 entering the mixing block 230, Of course, one skilled in the art will readily be able to vary the configuration of the mixing block 230 to accommodate additional gas flows.

Delivery of the cleaning agent from the plasma generation source 200 into the chambers 102 and 104 can be understood in greater detail by referring to FIG. 4, FIG. 5 and FIG. 6. The cleaning agent leaving the plasma generation source 200 enters the divider 202. The flow of cleaning agent splits into two flows as depicted by the flow arrows 604. The flows leave the divider 202 and enter a passage 420 of the first conduit 204 and a passage 602 of the second conduit 206.

The flow in the passage 420 enters the mixing block 230 through the side port 416. The flow, as depicted by the flow arrows 608, passes from the side port 416 to the bore 418, surrounding the gas delivery tube 410. The flow then passes through the mounting plate 426 and is diffused in the showerhead 437 by the blocker plate 436 and faceplate 438, then passing into the respective chamber as discussed above. Control of atmospheric conditions within the chambers 102 and 104 cause the flows depicted by arrows 608 from the plasma generation source 200 into the chambers 102 and 104, respectively, to be substantially equal. O-rings 422 are disposed at both ends of the first conduit 204 and the second conduit 206 to prevent the leakage of the cleaning agent.

The operation of the CVD apparatus 100 is best illustrated by referring primarily to FIG. 1, FIG. 3., and FIG. 6. In operation, the wafer 116 is set upon the pedestal 114 in each of the chambers 102 and 104. A pump (not shown) evacuates the chambers 102 and 104. The process and other gases are delivered to the mixing block 230 of each gas box 208 and 210, and thoroughly mixed in the cyclonic manner described above. The mixed gas passes into the chambers 102 and 104 after being diffused into a uniform flow by the faceplate 438 of the respective gas box. The mixed gas then deposits a layer of material upon the wafer 116. Once the desired thickness of deposition is achieved, the process and other gases are removed from the chambers 102 and 104.

Optionally, the deposition process may be enhanced by forming a process gas plasma within the chamber. If desired, the optional RF power source 118 is coupled to the respective gas boxes via the RF coupling tab 222. The RF power is coupled through the mounting plate 426 and into the faceplate 438. The RF power drives the faceplate 438, igniting and sustaining a plasma of mixed process and other gases within the respective chamber. Plasma enhanced processing enable the chambers to operate at lower temperature, provide additional process flexibility, and provide a capability for the chambers to be used for other types of deposition processes.

After the wafers 116 have been removed, a cleaning cycle begins. The plasma generation source 200 generates a cleaning agent, i.e., atomic Fluorine, that is delivered through the divider 202 and split into two flows depicted by flow arrow 604. The flows are delivered to the respective gas boxes via the first and second conduits 204 and 206. The cleaning agent flows around the outside of the gas delivery tube 410 and enters the respective chamber through the faceplate 438 in the manner described above. As the cleaning agent flows over the identical path taken by the mixed process and other gases (after exiting the gas delivery tube 410), the gas boxes 208 and 210 and chambers 102 and 104 are effectively scrubbed of substantially all material that may have been deposited during the CVD process.

Although the disclosed embodiment distributes a cleaning agent from a single plasma generation source to the chambers, the invention can be used to distribute reactive agents from a plasma generation source to the chambers. Such agents may be used to enhance or control the deposition process. As the embodiments that incorporate the teachings of the present invention have been shown and described in detail, those skilled in the art can readily devise many other varied embodiments that still incorporate these teachings.

What is claimed is:

1. A lid assembly for a semiconductor processing apparatus having at least two chambers, comprising:
    a lid plate having a first side and a second side, where the second side of the lid plate is disposed over said at least two chambers;
    a plasma generation source mounted to said first side of the lid plate;
    at least two gas boxes coupled to the first side of said lid plate; and
    a divider coupled between said plasma generation source and said at least two gas boxes.

2. The lid assembly of claim 1, wherein said at least two gas boxes are respectively disposed above said at least two chambers.

3. The lid assembly of claim 1, wherein each of said at least two gas boxes comprises:
    a mounting plate having an upper side and a lower side; and
    a mixing block coupled to said upper side of said mounting plate.

4. The lid assembly of claim 3, further comprising a showerhead coupled to said lower side of said mounting plate and disposed over one of said at least two chambers.

5. The lid assembly of claim 4, wherein each said showerhead comprises:
    a perforated blocker plate disposed below said lower side of said mounting plate to define a diffusion gap therebetween;
    a perforated faceplate coupled to a periphery of said mounting plate to define a plenum between said blocker plate and said face plate, wherein said perforated faceplate abuts against an isolator between said gas box and said lid plate.

6. The lid assembly of claim 5, wherein each said perforated faceplate is adapted for coupling to an RF source.

7. The lid assembly of claim 5, wherein each said mixing blocks comprises:
    a housing having a slot;
    a side port connected to the plasma generation source; and
    a bore extending from a bottom portion of said slot of said housing and through said mounting plate, and disposed over said blocker plate of said showerhead.

8. The lid assembly of claim 7, further comprising:
    at least two inlet manifolds disposed on said first side of said lid plate and adapted to receive gases from at least one gas source;
    at least two feed channels each having a pair of passages, each said feed channel respectively coupled between each said inlet manifold and each said mixer block.

9. The lid assembly of claim 8, wherein each said mixer block further comprises:
    a pair of cutouts extending in, but not through a wall of said slot, each one of said pair of cutouts respectively communicating with one of said pair of passages of one of said feed channels;
    a vortex generator disposed within said slot; and
    a gas delivery tube extending through said bore to define an exit aperture on a bottom of said vortex generator, wherein said gas delivery tube is disposed over said blocker plate of said shower head.

10. The lid assembly of claim 9, wherein each said slot is elliptical in shape.

11. The lid assembly of claim 9, wherein each said vortex generator comprises a wall and a bottom vortex portion that defines a substantially cylindrical interior volume, said wall of said vortex further comprises a pair of apertures between each of said cutouts and said pair of passages of said at least two feed channels, said cutouts and said apertures are laterally offset about a center of said vortex generator wherein fluids entering said vortex generator from said pair of passages are subjected to a cyclonic flow in said vortex generator, and said cyclonic fluid is dispersed from said gas delivery tube and into said chamber via said showerhead.

12. The lid assembly of claim 11, wherein the pair of apertures are 180 degrees apart from each other.

13. A semiconductor processing apparatus comprising:

at least two chambers; and a lid assembly disposed over said at least two chambers, wherein said lid assembly comprises a lid plate having a first side and a second side, a plasma generation source mounted to said first side of said lid plate, at least two gas boxes coupled to the first side of said lid plate, and a divider coupled to said plasma generation source and said at least two gas boxes.

14. The semiconductor processing apparatus of claim 13, wherein said at least two gas boxes respectively disposed above said at least two chambers.

15. The semiconductor processing apparatus of claim 14, wherein each of said at least two gas boxes comprises:

a mounting plate having an upper side and a lower side; and a mixing block coupled to said upper side of said mounting plate.

16. The semiconductor processing apparatus of claim 15, further comprising a showerhead coupled to said lower side of said mounting plate and disposed over one of said at least two chambers.

17. The semiconductor processing apparatus of claim 16, wherein each said showerhead comprises:

a perforated blocker plate disposed below said lower side of said mounting plate to define a diffusion gap therebetween;

a perforated faceplate coupled to a periphery of said mounting plate to define a plenum between said blocker plate and said face plate, wherein said perforated faceplate abuts against an isolator between said gas box and said lid plate.

18. The semiconductor processing apparatus of claim 16, wherein each said perforated faceplate is adapted for coupling to an RF source.

19. The semiconductor processing apparatus of claim 17, wherein each said mixing blocks comprises:

a housing having a slot;

a side port connected to the plasma generator; and a bore extending from a bottom portion of said slot of said housing and through said mounting plate, and disposed over said blocker plate of said showerhead.

20. The semiconductor processing apparatus of claim 19, further comprising:

at least two inlet manifolds disposed on said first side of said lid plate and adapted to receive gases from at least one gas source;

at least two feed channels each having a pair of passages, each said feed channel respectively coupled between each said inlet manifold and each said mixer block.

21. The semiconductor processing apparatus of claim 20, wherein each said mixer blocks further comprises:

a pair of cutouts extending in, but not through a wall of said slot, each one of said pair of cutouts respectively communicating with one of said pair of passages of one of said feed channels;

a vortex generator disposed within said slot; and a gas delivery tube extending through said bore to define an exit aperture on a bottom of said vortex generator, wherein said gas delivery tube is disposed over said blocker plate of said shower head.

22. The semiconductor processing apparatus of claim 21, wherein each said slot is elliptical in shape.

23. The semiconductor processing apparatus of claim 22, wherein each said vortex generator comprises a wall and a bottom vortex portion that defines a substantially cylindrical interior volume, said wall of said vortex further comprises a pair of apertures between each of said cutouts and said pair of passages of said at least two feed channels, said cutouts and said apertures are laterally offset about a center of said vortex generator wherein fluids entering said vortex generator from said pair of passages are subjected to a cyclonic flow in said vortex generator, and said cyclonic fluid is dispersed from said gas delivery tube and into said chamber via said showerhead.

24. The semiconductor processing apparatus of claim 23, wherein said pair of apertures are 180 degrees apart from each other.

* * * * *